(12) United States Patent
Letavic et al.

(10) Patent No.: US 9,337,310 B2
(45) Date of Patent: May 10, 2016

(54) LOW LEAKAGE, HIGH FREQUENCY DEVICES

(71) Applicant: INTERNATIONAL BUSINESS MACHINES CORPORATION, Armonk, NY (US)

(72) Inventors: Theodore J. Letavic, Putnam Valley, NY (US); Max G. Levy, Essex Junction, VT (US); Santosh Sharma, Essex Junction, VT (US); Yun Shi, South Burlington, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 4 days.

(21) Appl. No.: 14/269,599

(22) Filed: May 5, 2014

(65) Prior Publication Data

US 2015/0318378 A1 Nov. 5, 2015

(51) Int. Cl.
*H01L 29/66* (2006.01)
*H01L 21/265* (2006.01)
*H01L 29/78* (2006.01)

(52) U.S. Cl.
CPC .... *H01L 29/66681* (2013.01); *H01L 21/26586* (2013.01); *H01L 29/7816* (2013.01)

(58) Field of Classification Search
None
See application file for complete search history.

(56) References Cited

U.S. PATENT DOCUMENTS

| | | | |
|---|---|---|---|
| 4,713,681 A | 12/1987 | Beasom | |
| 6,762,457 B2 | 7/2004 | Pearce et al. | |
| 6,858,532 B2 | 2/2005 | Natzle et al. | |
| 7,554,154 B2 | 6/2009 | Hebert | |
| 7,719,054 B2 | 5/2010 | Williams et al. | |
| 7,795,674 B2 | 9/2010 | Yang et al. | |
| 7,829,945 B2 | 11/2010 | Adkisson et al. | |
| 8,101,479 B2 | 1/2012 | Parker et al. | |
| 8,174,071 B2 | 5/2012 | Tien et al. | |
| 8,450,802 B2 | 5/2013 | De Boet et al. | |
| 2004/0262685 A1 | 12/2004 | Zingg | |
| 2005/0090073 A1* | 4/2005 | Hawley et al. | 438/424 |

(Continued)

FOREIGN PATENT DOCUMENTS

DE 102006033692 A1 1/2008
DE 102006033692 B4 1/2011

(Continued)

OTHER PUBLICATIONS

Bulucea, C. "Physics, Technology, and Modeling of Complementary Asymmetric MOSFETs", IEEE Transactions on vol. 57, Issue: 10, 2010, pp. 2363-2380.

(Continued)

*Primary Examiner* — Anthony Ho
*Assistant Examiner* — Kevin Quinto
(74) *Attorney, Agent, or Firm* — Michael LeStrange; Andrew M. Calderon; Roberts, Mlotkowski, Safran & Cole PC

(57) ABSTRACT

Low leakage, high frequency devices and methods of manufacture are disclosed. The method of forming a device includes implanting a lateral diffusion drain implant in a substrate by a blanket implantation process. The method further includes forming a self-aligned tapered gate structure on the lateral diffusion drain implant. The method further includes forming a halo implant in the lateral diffusion drain implant, adjacent to the self-aligned tapered gate structure and at least partially under a source region of the self-aligned tapered gate structure.

18 Claims, 7 Drawing Sheets

(56) References Cited

U.S. PATENT DOCUMENTS

| | | | |
|---|---|---|---|
| 2008/0023785 A1* | 1/2008 | Hebert | 257/492 |
| 2008/0153239 A1* | 6/2008 | Su et al. | 438/302 |
| 2008/0246086 A1 | 10/2008 | Korec et al. | |
| 2012/0228705 A1 | 9/2012 | Toh et al. | |
| 2012/0280319 A1 | 11/2012 | Roehrer | |
| 2013/0119466 A1 | 5/2013 | Chung et al. | |
| 2013/0181287 A1 | 7/2013 | Zhang et al. | |
| 2013/0256698 A1 | 10/2013 | Sdrulla et al. | |

FOREIGN PATENT DOCUMENTS

| | | |
|---|---|---|
| WO | 9833218 | 7/1998 |
| WO | 2004102672 A1 | 11/2004 |

OTHER PUBLICATIONS

Sun, W. "High-Voltage Power IC Technology With nVDMOS, RESURF pLDMOS, and Novel Level-Shift Circuit for PDP Scan-Driver IC", IEEE Transactions on vol. 53, Issue: 4, 2006, pp. 891-896.

Ludikhuize, "High-Voltage DMOS and PMOS in Analog IC's," published in the 1982 IEDM proceedings, 9 pages.

U.S. Appl. No. 14/585,933, filed Dec. 30, 2014, 40 pages, not yet published.

"List of IBM Patents or Patent Applications Treated as Related" submitted herewith; 1 page.

\* cited by examiner

LOW LEAKAGE, HIGH FREQUENCY DEVICES

FIELD OF THE INVENTION

The invention relates to semiconductor structures and, more particularly, to low leakage, high frequency devices and methods of manufacture.

BACKGROUND

Laterally diffused metal oxide semiconductor (LDMOS) devices are used in many different types of applications including cellular telephones as RF power amplifiers. In cellular applications, though, LDMOS devices are known to deplete battery life quickly due to its need for high voltage and high frequency.

In LDMOS devices, an N-well is fabricated in a substrate using a mask and implantation processes. A tapered gate structure is formed over the N-well, with the tapered portion of the gate structure aligning with an edge of the drift region and the N-well, itself, e.g., also referred to as drain well to step-oxide spacing (D). As one of skill in the art would understand, the thicker portion of the underlying dielectric material of the gate structure is a drain region and the thinner portion of the underlying dielectric material of the gate structure is a source region. A P-well is formed in the substrate, adjacent to the source region. The distance between the P-well and the N-well is a drain well spacing (E).

The structures of the conventional LDMOS device are not self-aligned and hence do not scale very well. That is, for example, the P-well and the N-well and hence the critical dimensions "D" and "E" are non-self-aligned, resulting in difficulties with scaling of such features. For example, device pitch (hence specific on-resistance (Ron, SP)) and breakdown voltage are limited by photolithography process, such as the body to drain well spacing (E) and the drain well to step-oxide spacing (D). In more specific examples, as the devices are scaled down, misaligned occurs with the critical dimensions "E" and "D", hence affecting device performance including breakdown voltage, tunneling effects, etc.

SUMMARY

In an aspect of the invention, a method of forming a device comprises implanting a lateral diffusion drain implant in a substrate by a blanket implantation process. The method further comprises forming a self-aligned tapered gate structure on the lateral diffusion drain implant. The method further comprises forming a halo implant in the lateral diffusion drain implant, adjacent to the self-aligned tapered gate structure and at least partially under a source region of the self-aligned tapered gate structure.

In an aspect of the invention, a method comprises forming a lateral diffusion drain implant in a substrate by a segmented blanket implant process, without the use of a mask. The method further comprises forming a gate structure on the lateral diffusion drain implant. The method further comprises forming a self-aligned halo implant in the lateral diffusion drain implant and at least partially under a source region of the gate structure. The halo implant is formed by an angled implant process.

In an aspect of the invention, a structure comprises: a blanket lateral diffusion drain implant in a substrate; a self-aligned tapered gate structure formed on the lateral diffusion drain implant; and a self-aligned halo implant in the lateral diffusion drain implant and at least partially under a source region of the gate structure. The halo implant abuts directly against the blanket lateral diffusion drain.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the leakage, high frequency devices, which comprises the structures of the present invention. In still further embodiments, a method in a computer-aided design system is provided for generating a functional design model of leakage, high frequency devices. The method comprises generating a functional representation of the structural elements of the leakage, high frequency devices.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
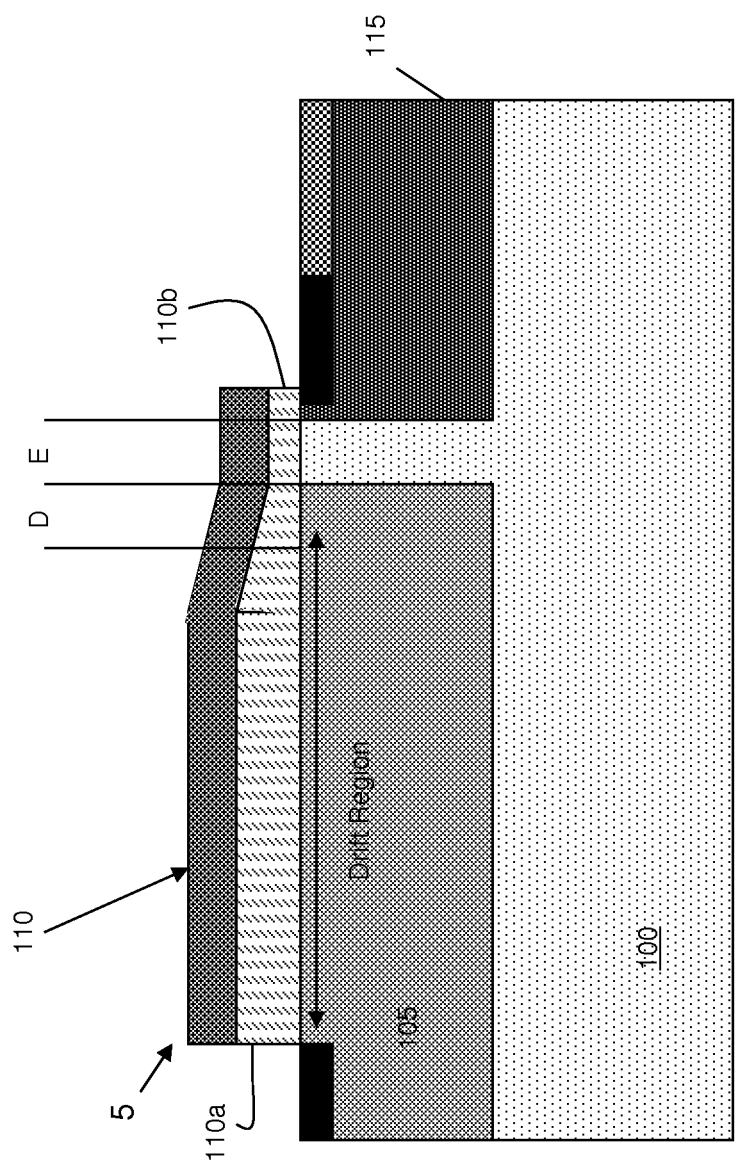
FIG. 1 shows an LDMOS device.

The invention relates to semiconductor structures and, more particularly, to low leakage, high frequency devices and methods of manufacture. More specifically, the present invention provides an extended drain design for low leakage, high frequency radio frequency laterally diffused metal oxide semiconductor (RF LDMOS) devices and methods of manufacture. In embodiments, the devices of the present invention are suited for high speed/high breakdown/large slew rate and fast switching applications. The processes of the present invention can be used with both NMOS and PMOS devices.

The designs of the present invention solve the fundamental design trade-off between lower Ron and band-to-band tunneling by providing a dielectric stack/profile over a doped drain region as discussed in more detail herein. For example, the RF LDMOS devices of the present invention reduce/delay the onset of band-to-band tunneling, thereby resulting in improved performance characteristics. Also, the designs of the present invention enable a "scalable by layout" device in regular high voltage (HV) CMOS processes that can address integrated controller and power amplifier solutions with minimal added process complexity. In fact, the present invention is capable of reducing misaligned tolerances by eliminating several critical alignment features as described herein.

In more specific examples, by implementing the processes of the present invention it is possible to provide self-aligned, tight pitch complimentary LDMOS devices for high frequency, high voltage, low Ron (specific) applications. For example, in embodiments, the devices of the present invention can achieve superior reliability and breakdown characteristics, e.g., a breakdown voltage of up to about 20 V. The present invention also provides 3D layout techniques to reduce parasitic MOS channel effects.

The advantages of the present invention can be achieved, in part, by forming a blanket N-well region (also referred to as a lateral diffusion drain implant) with a self-aligned P-well (also referred to as a halo implant). The reliability and breakdown characteristics can also be improved with combinations of other designs such as, for example, a P-type tongue connected (linked) to the lateral diffusion drain implant. Moreover, the present invention can exhibit lower gate to drain capacitance (than conventional devices) by using an additional depletion from a P-type (type 2) implant. The devices of the present invention can also exhibit increased corner device Vt control by (i) adding a P-well along fingertips of a gate structure or (ii) thicker gate oxide at the fingertip of the gate structure.

The RF LDMOS and related structures of the present invention can be manufactured in a number of ways using a number of different tools. In general, though, the methodologies and tools are used to form structures with dimensions in the micrometer and nanometer scale. The methodologies, i.e., technologies, employed to manufacture the RF LDMOS and related structures of the present invention have been adopted from integrated circuit (IC) technology. For example, the structures of the present invention are built on wafers and are realized in films of material patterned by photolithographic processes on the top of a wafer. In particular, the fabrication of the RF LDMOS and related structures of the present invention uses three basic building blocks: (i) deposition of thin films of material on a substrate, (II) applying a patterned mask on top of the films by photolithographic imaging, and (iii) etching the films selectively to the mask.

FIG. 1 shows an LDMOS device 5, where an N-well 105 is fabricated in a substrate 100 using a photomask and implantation processes. A tapered gate structure 110 is formed over the N-well, with the tapered portion of the gate structure 110 aligning with an edge of the drift region and the N-well 105, itself, e.g., shown as critical dimension "D" (also referred to as drain well to step-oxide spacing (D)). The thicker portion 110a of the underlying dielectric material of the gate structure 110 is a drain region and the thinner portion 110b of the underlying dielectric material of the gate structure 110 is a source region. A P-well 115 is formed in the substrate 100, adjacent to the source region. As shown in FIG. 1, the distance between the P-well 115 and the N-well 105 is critical dimension "E" (also referred to as drain well spacing (E)).

The structures of the LDMOS device 5 are not self-aligned and hence do not scale very well. That is, for example, the P-well 115 and the N-well 105 and hence the critical dimensions "D" and "E" are non-self-aligned, resulting in difficulties with scaling of such features. In more specific examples, as the devices are scaled down, misaligned occurs with the critical dimensions "E" and "D", hence affecting device performance including breakdown voltage, tunneling effects, etc.

Figure 2:
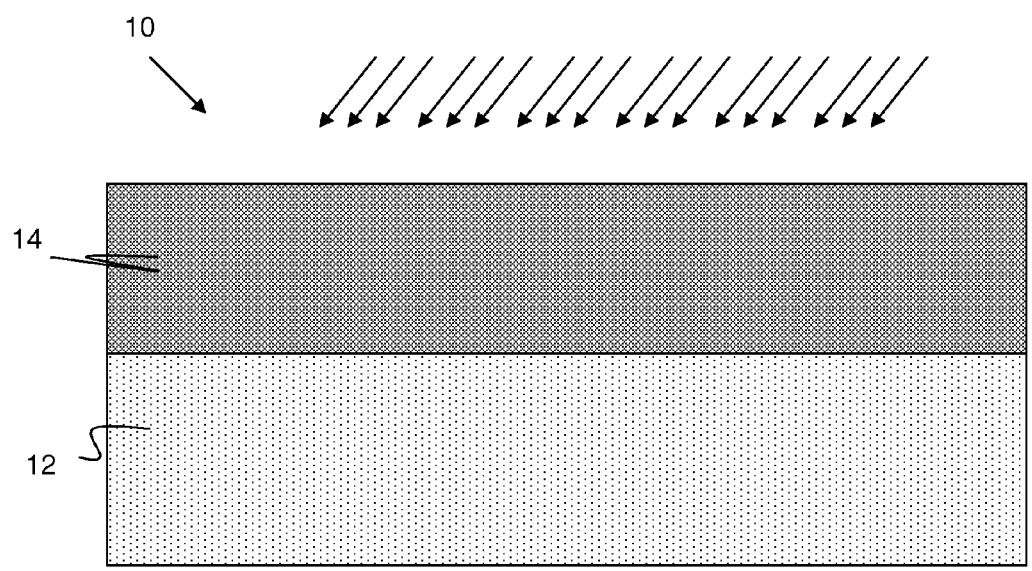
FIGS. 2-5 show structures and respective manufacturing processes in accordance with aspects of the present invention.

FIG. 2 shows a structure and respective processing steps in accordance with aspects of the present invention. In particular, the structure 10 of FIG. 2 includes a substrate 12 (e.g., P-type substrate) subjected to a blanket ion implantation process (represented by arrows) to form an N-well region 14 (lateral diffusion drain implant). Advantageously, the blanket ion implantation process will eliminate a critical misaligned issue for scaled devices, e.g., alignment between a stepped gate oxide and drift region.

In embodiments, the N-well region 14 is formed without a mask, thereby covering an entire region of a substrate 12. In specific embodiments, the blanket ion implantation process is a phosphorus implantation process, implanted at stages of between 50 Kv to 300 Kv at a dosage of about $10^{13}$ atoms/$cm^2$. For example, the blanket phosphorus ion implantation process can include several ion implantation segments of different energies, e.g., 1.0-1.5 $10^{13}$ at 75 keV, 150 keV, and 170 keV). By increasing the implantation dosage of the N-well region 14, it is possible to improve Ron performance, e.g., lower the Ron.

Figure 3:
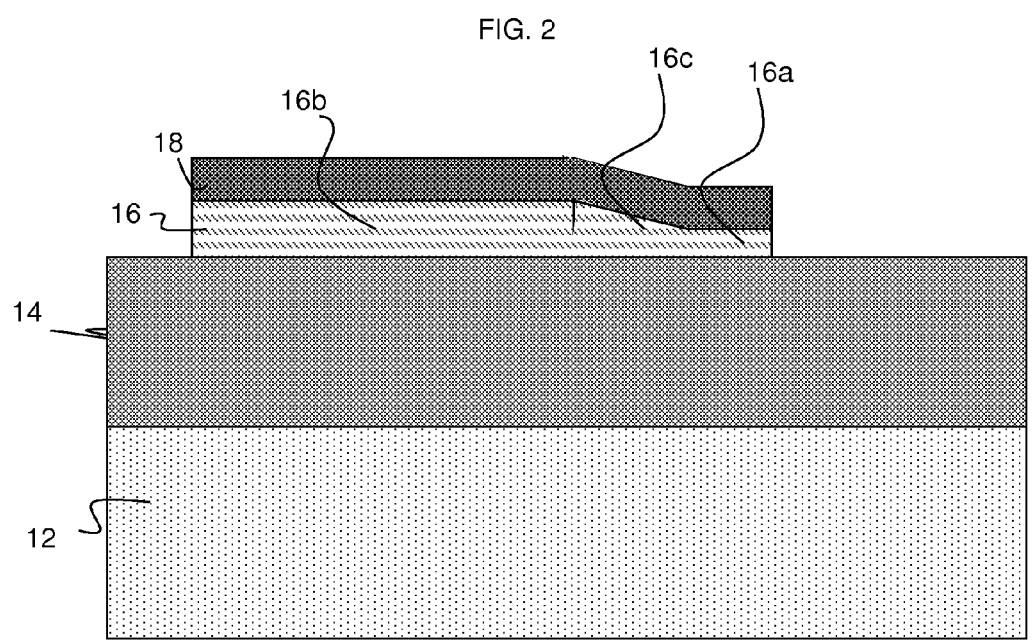

In FIG. 3, a tapered gate dielectric 16 is formed over the N-well region 14. In embodiments, the tapered gate dielectric 16 includes a source region 16a, a drain region 16b and a tapered region 16c. The source region 16a can have a thickness of about 30 Å to 70 Å, and preferably about 35 Å; whereas, the drain region 16b can have a thickness of about 150 Å to 180 Å. It should be understood, though, that the source region 16a and the drain region 16b can have other dimensions, depending on the desired performance characteristics of the device. In any scenario, though, the tapered portion 16c is self-aligned with an edge of the drift region of the N-well region 14, regardless of the salability of the device. Thus, by using the fabrication processes of the present invention, e.g., blanket deposition of the N-well region 14, it is now possible to avoid misaligned tolerances between the N-well region 14 and the tapered portion 16c (i.e., drain well to step-oxide spacing).

In embodiments, the tapered gate dielectric 16 can be an oxide material (e.g., $SiO_2$) or other gate dielectric material fabricated using conventionally known processes. By way of example, the oxide material can be grown on the substrate 12 and thereafter patterned using photolithographic and etching processes, known to those of skill in the art. More specifically, a dual gate oxide process can contain a thermal growth of a thick gate oxide (of approximate thickness of 120-180 Å), followed by a photoresist patterning and etch in dilute hydrofluoric acid. Proper selection of the etchant and dielectric properties results in a tapered window edge of specified angle. Removal of the photoresist and growth of the thin gate oxide (of approximate thickness of 30-70 Å) completes the tapered dielectric formation. It should be noted that the thick gate oxide could be a combination of a thermally grown oxide and a deposited dielectric, and the dielectric etch can be a combination of a reactive ion etch (RIE) and a dilute wet etch.

Still referring to FIG. 3, a poly material 18 can be deposited and patterned on the tapered gate dielectric 16. In embodiments, the poly material 18 can be an N+ doped poly material deposited using conventional deposition processes including, for example, chemical vapor deposition (CVD) processes. The patterning can be performed using conventional photolithographic and etching processes, e.g., reactive ion etching (RIE).

Figure 4:
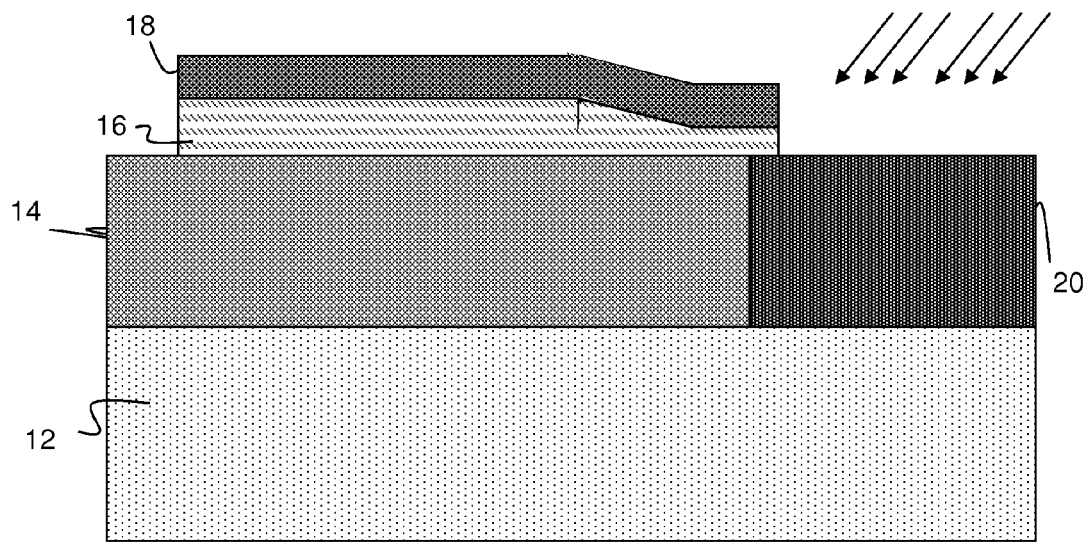

In FIG. 4, a halo implant region 20 can be formed in the substrate 12 by a self-aligned halo and extension implant process to set up a short channel length and Vt. More specifically, the halo implant region 20 is formed in the N-well region 14, thereby ensuring that the halo implant region 20 directly abuts the N-well region 14 under the source region 16*b* of the gate dielectric 16. By forming the halo implant region 20 in the N-well 14 after gate formation, the halo implant region 20 will be self-aligned with the lateral diffusion drain implant (N-well 14) and the tapered gate structure. By abutting directly against the N-well region 14 it is now possible to eliminate a misalignment of a second critical feature, e.g., avoid misalignment tolerances (gaps) between the N-well region 14 and the halo implant region 20. In this way, it is possible to enable tight pitch devices with high breakdown voltage/low Ron,sp and high Ft.

In embodiments, the halo implant region 20 is formed using a tilted halo implantation process. More specifically, in embodiments, the tilted halo implantation is performed at an angle of about 30° to 45°, with respect to the surface of the substrate 12. The tilted halo implantation can be performed using boron, $BF_2$ and/or indium at energy levels of about 5 Kv to 150 Kv at a dosage of about $10^{12}$ atoms/$cm^2$ to $10^{13}$ atoms/$cm^2$.

Figure 5:
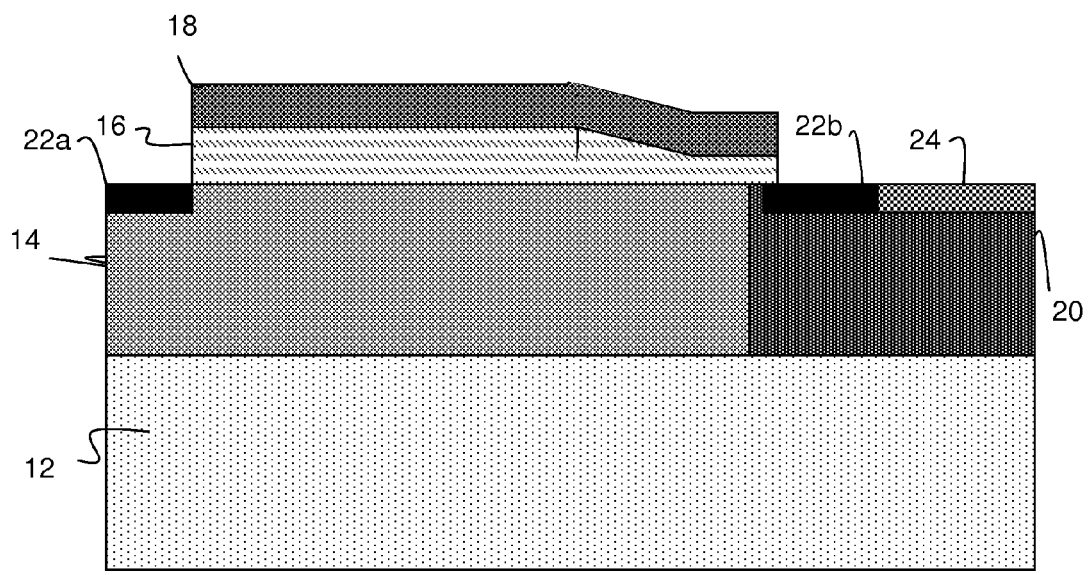

FIG. 5 shows formation of an N+ contact 22*a*, N+ implant 22*b* and P+ implant 24 in the halo implant region 20. Advantageously, the N+ contact 22*a*, N+ implant 22*b* and P+ implant 24 can be formed using conventional CMOS processes, e.g., masking and implant processes, during fabrication processes for other devices formed on the substrate. For example, the N+ contact 22*a* and N+ implant 22*b* can be formed using an arsenic and/or phosphorus implant during other device fabrication processes (e.g., CMOS bipolar devices). On the other hand, the P+ implant 24 can be formed using boron during other device fabrication (e.g., CMOS bipolar devices).

Figure 6:
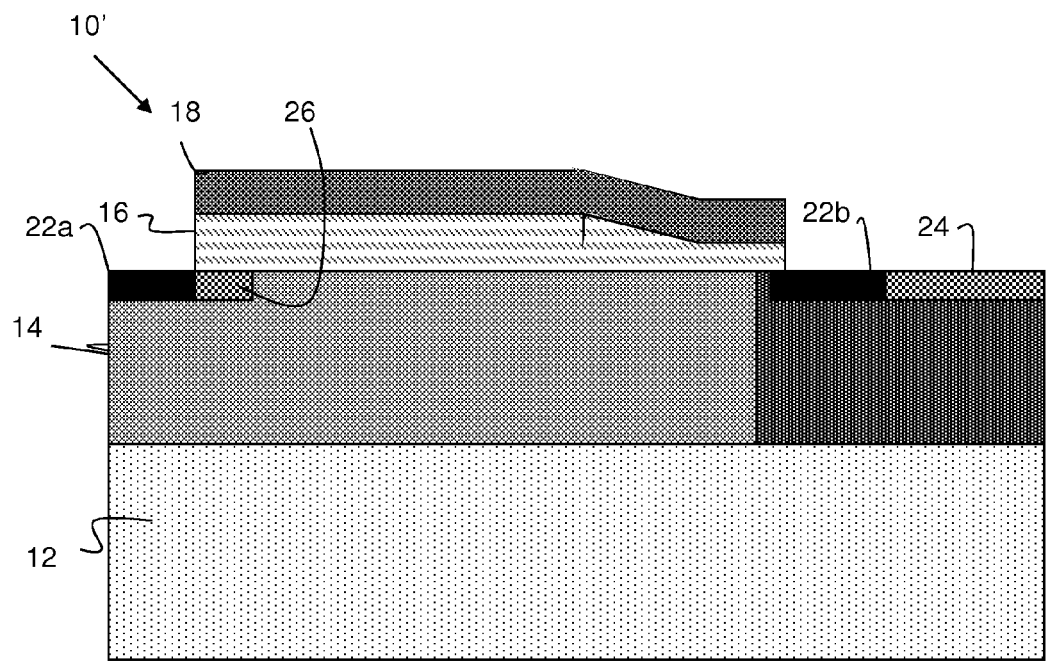
FIG. 6 shows an alternative structure and respective manufacturing processes in accordance with aspects of the present invention.

FIG. 6 shows an alternative structure and respective manufacturing processes in accordance with aspects of the present invention. The structure 10' includes a self-aligned P-type pocket implant 26, at the drain side of the N-well region 14, e.g., at the junction of the gate dielectric 16 and N+ contact 22*a*. In embodiments, the P-type pocket implant 26 can be a boron P-type pocket implant formed using an angled implantation process, for example. In embodiments, the P-type pocket implant 26 will provide improved breakdown voltage characteristics for the LDMOS device; that is, the P-type pocket implant 26 will reduce off current leakage associated with the gate dielectric 16 and hence improve voltage characteristics of the device (e.g., higher voltages are possible), compared to a conventional device such as shown in FIG. 1.

Figure 7:
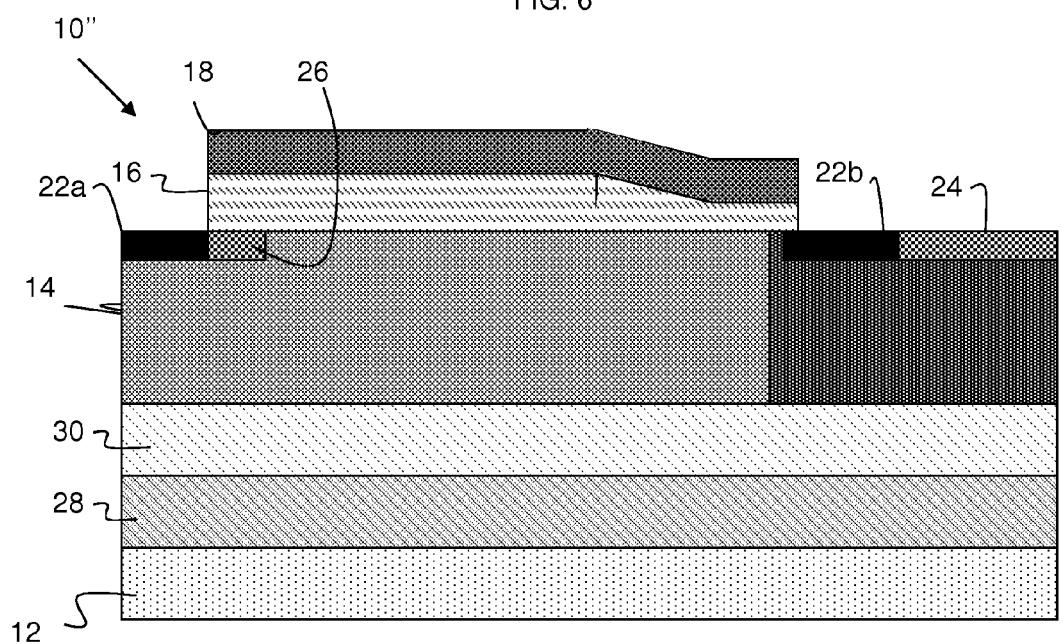
FIG. 7 shows another alternative structure and respective manufacturing processes in accordance with aspects of the present invention.

FIG. 7 shows another alternative structure and respective manufacturing processes in accordance with aspects of the present invention. In the structure 10" of FIG. 7, a buried tongue implant 28 and a highly doped P-type implant region 30 are formed in the substrate 12. In embodiments, the buried tongue implant 28 will contact (link to) the N-well region 14 to create a contiguous P-type layer under the blanket drift well (N-well region 14) connected to the body potential. It should be understood by those of skill in the art that the P-type pocket implant 26 can be an optional feature in the structure 10".

Still referring to FIG. 7, the buried tongue implant 28, highly doped P-type implant region 30 and the N-well region 14 can be formed with the same mask, and in any processing order (e.g., depending on the tooling and/or processing parameters) prior to the formation of the gate dielectric 16. By way of example, the buried tongue implant 28 can be formed using a boron ion implantation process at an energy level of about 600 kV; whereas, the highly doped P-type implant region 30 is formed with a phosphorus ion implantation process at a higher energy level. In this way, the N-well region 14 will have the lowest dopant concentration.

Advantageously, the buried tongue implant 28 will isolate the device from the substrate 12, improving the breakdown voltage characteristics of the device. Also, by contacting the N-well region 14, the buried tongue implant 28 enables negative voltage capability and provides a path for impact ionized holes.

Figure 8:
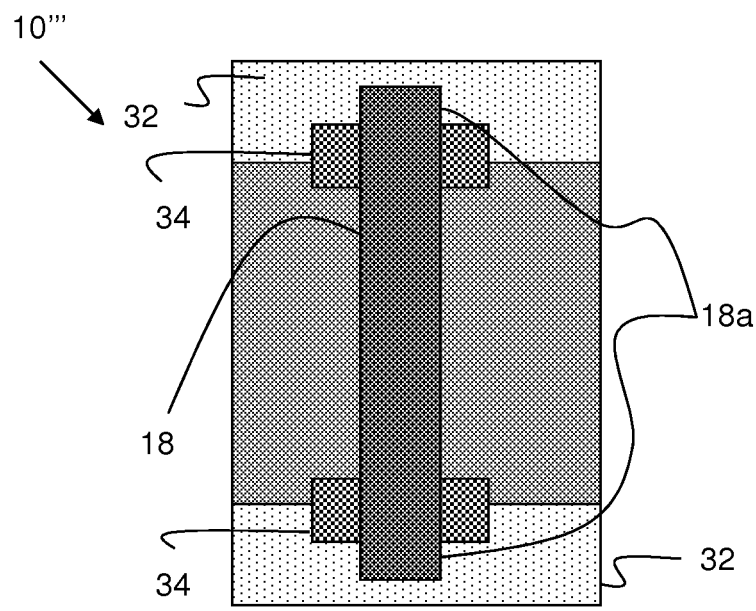
FIG. 8 shows a top view of a structure and respective manufacturing processes in accordance with aspects of the present invention.

FIG. 8 shows a top view of a structure 10''' and respective manufacturing processes in accordance with aspects of the present invention. It should be understood by those of skill in the art that the structure 10''' of FIG. 8 can include the design features of FIGS. 6 and 7, for example. In FIG. 8, a fingertip region 18*a* of a transistor (e.g., shown as the poly material 18) extends onto a shallow trench isolation structure 32. As further shown in FIG. 8, the fingertip region 18*a* will also crossover a P-well 34 formed during CMOS fabrication process. In embodiments, the P-well 34 can be, for example, a 1.8V or 5V P-well which increases the Vt. In this way, the structure 10''' of FIG. 8 will exhibit improved corner device control (e.g., ensure that the corner device does not turn on) and reduced leakage current.

Figure 9:
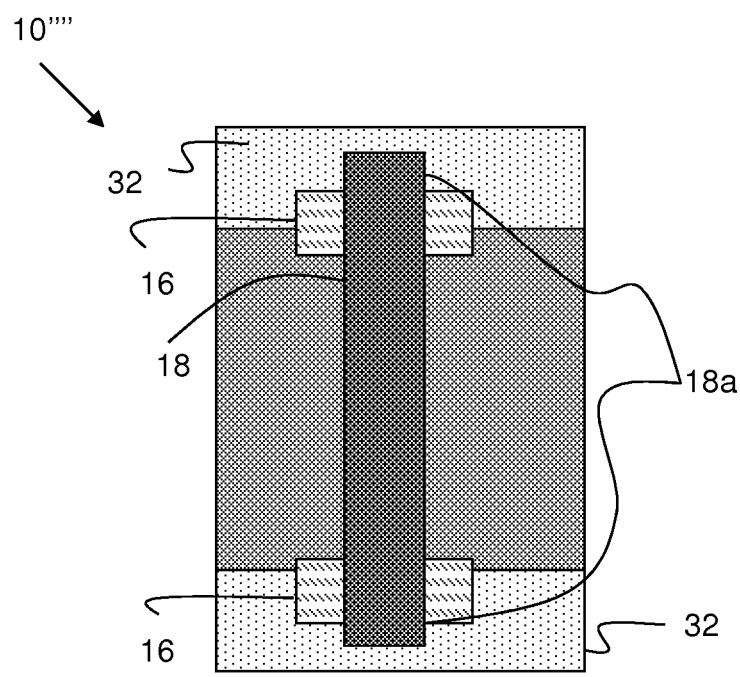
FIG. 9 shows a top view of an alternative structure and respective manufacturing processes in accordance with aspects of the present invention.

FIG. 9 shows a top view of an alternative structure and respective manufacturing processes in accordance with aspects of the present invention. It should be understood by those of skill in the art that the structure 10'''' of FIG. 9 can include the design features of FIGS. 6 and 7, for example. In FIG. 9, the fingertip region 18*a* of the transistor (e.g., shown as the poly material 18) extends onto the shallow trench isolation structure 32 and also crosses over an extended portion of a thick oxide portion of the gate dielectric 16 (formed by extending the mask during the dielectric patterning). In this way, the structure 10'''' of FIG. 9 will exhibit improved corner device control (e.g., ensure that the corner device does not turn on) and reduced leakage current.

Figure 10:
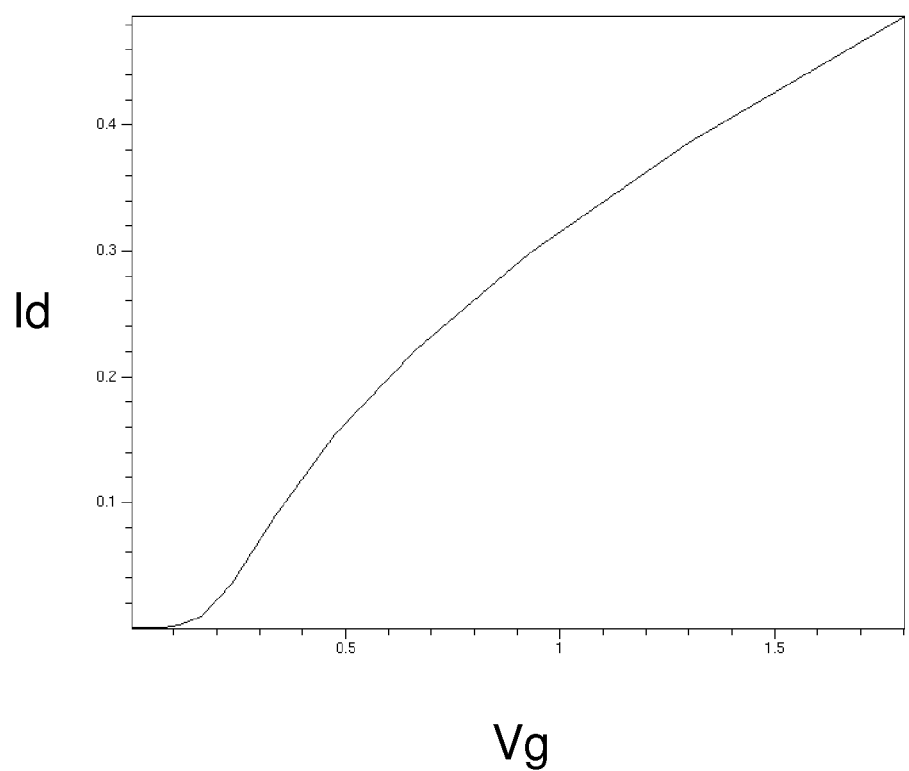
FIG. 10 shows a performance graph of a device manufactured in accordance with aspects of the present invention.

FIG. 10 shows a performance graph of a device manufactured in accordance with aspects of the present invention. More specifically, FIG. 10 shows a performance graph of the gate characteristics, with the "Y" axis representing current (Id) and the "X" axis representing voltage (Vg). As shown in this representative plot, the devices of the present invention are able to obtain high voltages at high currents, thereby exhibiting improved frequency performance.

Figure 11:
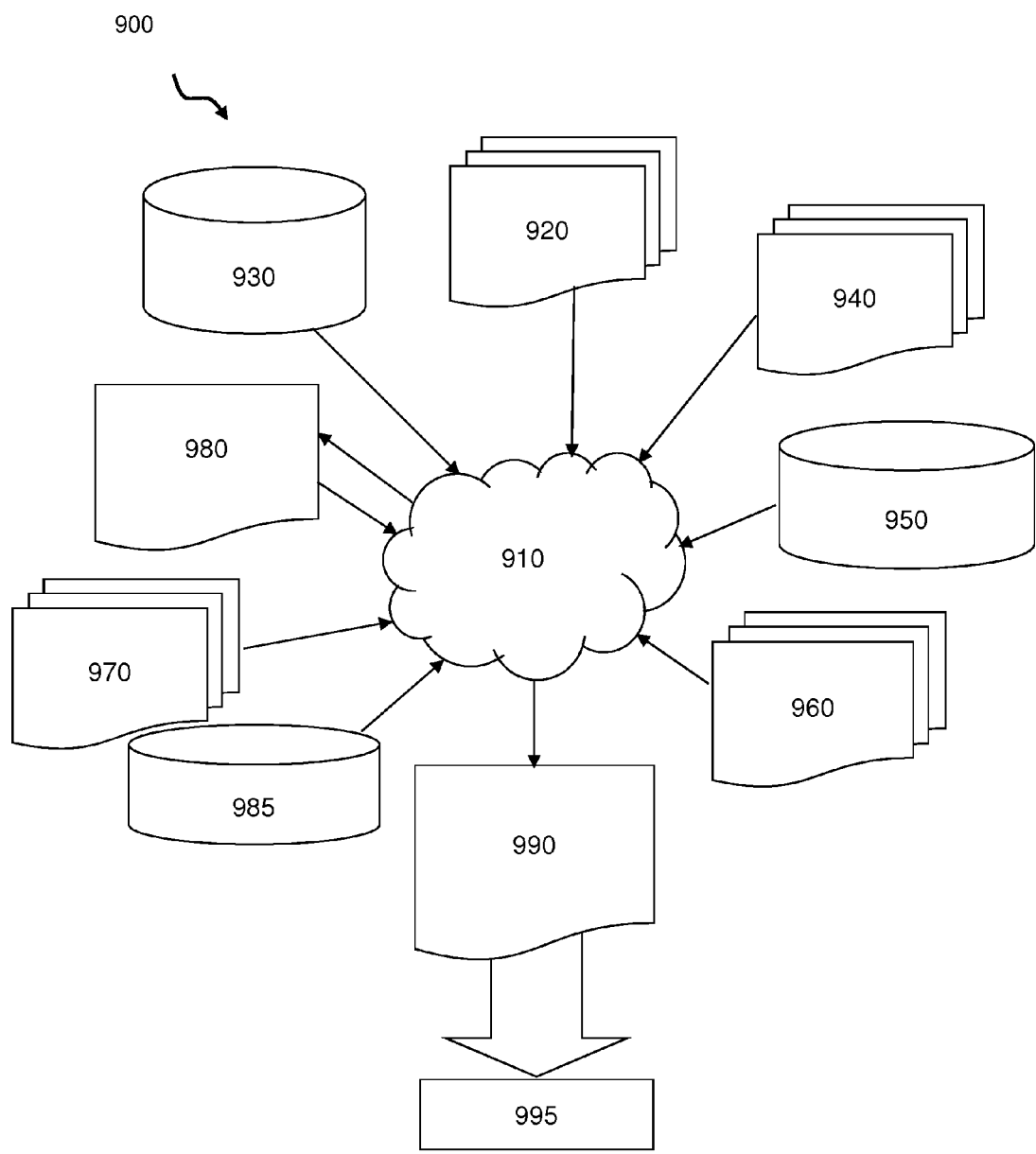
FIG. 11 is a flow diagram of a design process used in semiconductor design, manufacture, and/or test.

FIG. 11 is a flow diagram of a design process used in semiconductor design, manufacture, and/or test. FIG. 11 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-9. In one embodiment, design structure 990 may comprise a compiled, executable HDL simulation model that functionally simulates the devices shown in FIGS. 2-9.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-9. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a device, comprising:
   implanting a lateral diffusion drain implant in a substrate by a blanket implantation process;
   forming a self-aligned tapered gate structure on the lateral diffusion drain implant; and
   forming a halo implant in the lateral diffusion drain implant, adjacent to the self-aligned tapered gate structure and at least partially under a source region of the self-aligned tapered gate structure, wherein the halo implant is self-aligned with the lateral diffusion drain implant and the self-aligned tapered gate structure.

2. The method of claim 1, wherein the lateral diffusion drain implant is formed without a mask.

3. The method of claim 1, further comprising forming oxide under fingertips of the self-aligned tapered gate structure, at a junction between the lateral diffusion drain implant and a shallow trench isolation structure.

4. The method of claim 1, wherein the halo implant is formed through an angle implantation process after formation of the lateral diffusion drain implant.

5. The method of claim 1, further comprising forming a self-aligned P-type pocket implant, at a drain side of the lateral diffusion drain implant.

6. The method of claim 1, further comprising forming P-wells under fingertips of the self-aligned tapered gate structure, at a junction between the lateral diffusion drain implant and a shallow trench isolation structure.

7. The method of claim 6, wherein forming of the P-wells are by CMOS processes for a different device.

8. The method of claim 1, further comprising forming a buried tongue implant and a highly doped P-type implant region in the substrate.

9. The method of claim 8, wherein the buried tongue implant is formed in contact with the lateral diffusion drain implant to create a contiguous P-type layer under the lateral diffusion drain implant and connected to a body potential.

10. The method of claim 8, wherein the buried tongue implant, the highly doped P-type implant region and the lateral diffusion drain implant are formed with a same mask.

11. A method, comprising:
    forming a lateral diffusion drain implant in a substrate by a segmented blanket implant process, without using a mask;
    forming a gate structure on the lateral diffusion drain implant; and
    forming a self-aligned halo implant in the lateral diffusion drain implant and at least partially under a source region of the gate structure by an angled implant process.

12. The method of claim 11, wherein the gate structure is a tapered gate structure which is self-aligned with the lateral diffusion drain implant and is further formed with a thicker oxide layer at a junction between the lateral diffusion drain implant and shallow trench isolation structures.

13. The method of claim 12, wherein fingertips of the gate structure are formed over the thicker oxide layer at the junction between the lateral diffusion drain implant and the shallow trench isolation structures.

14. The method of claim 11, wherein the gate structure is formed over P-well regions at a junction between the lateral diffusion drain implant and shallow trench isolation structures.

15. The method of claim 11, further comprising forming a self-aligned P-type pocket implant, at a drain side of the lateral diffusion drain implant.

16. The method of claim 11, further comprising forming a buried tongue implant and a highly doped P-type implant region in the substrate, wherein:
    the buried tongue implant is formed in contact with the lateral diffusion drain implant to create a contiguous P-type layer under the lateral diffusion drain implant and connected to a body potential; and
    the buried tongue implant, the highly doped P-type implant region and the lateral diffusion drain implant are formed with a same mask.

17. A structure, comprising:
    a blanket lateral diffusion drain implant in a substrate;
    a self-aligned tapered gate structure formed on the lateral diffusion drain implant;
    a self-aligned halo implant in the lateral diffusion drain implant and at least partially under a source region of the gate structure, wherein the halo implant abuts directly against the blanket lateral diffusion drain; and
    a self-aligned P-type pocket implant, at a drain side of the lateral diffusion drain implant.

18. The structure of claim 17, further comprising a buried tongue implant formed in contact with the lateral diffusion drain implant to create a contiguous P-type layer under the lateral diffusion drain implant and connected to a body potential.

* * * * *